(12) United States Patent
Uekawa et al.

(10) Patent No.: US 9,054,145 B2
(45) Date of Patent: Jun. 9, 2015

(54) SUBSTRATE TRANSFER APPARATUS

(75) Inventors: Daisuke Uekawa, Shizuoka (JP);
Kazuaki Yamada, Shizuoka (JP)

(73) Assignee: Yamaha Hatsudoki Kabushiki Kaisha,
Shizuoka-ken (JP)

( * ) Notice: Subject to any disclaimer, the term of this patent is extended or adjusted under 35 U.S.C. 154(b) by 196 days.

(21) Appl. No.: 13/604,477

(22) Filed: Sep. 5, 2012

(65) Prior Publication Data

US 2013/0074326 A1 Mar. 28, 2013

(30) Foreign Application Priority Data

Sep. 27, 2011 (JP) ................................. 2011-210245

(51) Int. Cl.
  *B23P 19/00* (2006.01)
  *H01L 21/677* (2006.01)
  *H05K 13/02* (2006.01)
  *H05K 13/00* (2006.01)
  *H05K 13/08* (2006.01)
(52) U.S. Cl.
  CPC .............. *H01L 21/677* (2013.01); *H05K 13/02* (2013.01); *H05K 13/0061* (2013.01); *H05K 13/08* (2013.01)
(58) Field of Classification Search
  CPC ................... H01L 21/67778; H01L 21/67736; H01L 21/6773; H01L 21/67766; H01L 21/67742; B65G 43/08
  USPC ........................... 29/739, 729, 742, 759, 760; 198/341.01, 346.3, 464.2, 465.1, 465.4
  See application file for complete search history.

(56) References Cited

U.S. PATENT DOCUMENTS 6,189,674 B1\* 2/2001 Izumida et al. ........... 198/341.01
7,234,584 B2\* 6/2007 Rice et al. .................. 198/465.1

FOREIGN PATENT DOCUMENTS

| JP | H05-8835 A | 1/1993 | |
| JP | 2001-274594 | \* 10/2001 | ............. H05K 13/02 |
| JP | 2003-110286 A | 4/2003 | |
| JP | 2004-359433 A | 12/2004 | |

(Continued)

OTHER PUBLICATIONS

An Office Action issued by the Korean Patent Office on Oct. 23, 2013, which corresponds to Korean Patent Application No. 10-2012-0101600 and is related to U.S. Appl. No. 13/604,477; with English summary.

(Continued)

*Primary Examiner* — Thiem Phan
(74) *Attorney, Agent, or Firm* — Studebaker & Brackett PC

(57) ABSTRACT

A substrate stopped at a first position is transferred toward a second position and is stopped at the second position in an accurate and stable manner. An intermediate position arrival time AT is measured while the substrate is being transferred from a substrate stop position toward a mounting work position, and a transfer status of the substrate (whether or not an unexpected factor has occurred) is assessed based on the intermediate position arrival time AT. Before the substrate reaches the second position, a deceleration pattern is controlled by altering a deceleration start timing T14 and the deceleration b in accordance with the intermediate position arrival time AT, thereby accurately stopping and positioning the substrate at the mounting work position. In this manner, under feed-forward control, the substrate can be stably transferred to the mounting work position.

8 Claims, 9 Drawing Sheets

(56) References Cited

FOREIGN PATENT DOCUMENTS

| JP | 2007-173553 A | 7/2007 |
| JP | 2008-227303 A | 9/2008 |
| JP | 2009-027202 A | 2/2009 |

OTHER PUBLICATIONS

The extended European search report issued by the European Patent Office on Nov. 3, 2014, which corresponds to European Patent Application No. 12006130.4-1803 and is related to U.S. Appl. No. 13/604,477.

* cited by examiner

SUBSTRATE TRANSFER APPARATUS

BACKGROUND OF THE INVENTION

1. Field of the Invention

The present invention relates to a substrate transfer apparatus and a substrate transfer method to transfer a substrate stopped at a first position toward a second position and to stop the substrate at the second position, and a surface mounter that mounts components on the substrate positioned at the second position by the substrate transfer apparatus.

2. Description of the Background Art

With a substrate processing system that mounts electronic components on a substrate, substrate processing apparatuses such as a printer, a print inspector, a surface mounter, a mount inspection apparatus, and the like are installed side by side along a transfer path. The respective substrate processing apparatuses perform desired processes according to a processing program on a substrate transferred along a substrate transfer path. As for a surface mounter, for example, a substrate transfer mechanism transfers a substrate to a predetermined target position of the surface mounter. The substrate transfer mechanism then stops the substrate at a predetermined target position. The transferred substrate is then subjected to a component mounting where electronic components, such as an IC (Integrated Circuit) supplied from a component supplying section such as a tape feeder, are mounted onto the substrate. Upon completing the component mounting operation, the substrate is shipped from the target position. Such a series of substrate processing operations (substrate transfer, component mounting, and substrate shipping) is repetitively performed.

In order to perform the substrate processing operations described above on substrates of the same type in an efficient manner, the substrates must be transferred accurately to a target position. Also the substrates must be positioned accurately at the target position. To meet with the demand, a conventional apparatus, for example described in JP Patent Publication No. 2009-27202, obtains an amount of misregistration amount of an actual substrate stop position with respect to a target position of a substrate in order to execute a feedback control. The substrate transfer parameters are then modified in accordance with the misregistration amount. The apparatus transfers a next substrate using the modified substrate transfer parameters. Relying upon the aforementioned feedback control, the conventional apparatus tried to achieve appropriate substrate transfer.

According to the apparatus described in JP Patent Publication No. 2009-27202, substrate processing operations must be performed on at least one substrate to obtain an amount of misregistration in order to optimize substrate transfer. Therefore, it is still difficult to perform accurate operation with respect to a first substrate in transferring to the target position. In addition, unexpected factors may arise during substrate transfer such as an occurrence of belt deterioration or substrate slippage while a substrate is being transferred by a belt. However, the apparatus described in JP Patent Publication No. 2009-27202 is unable to accommodate such unexpected factors. Hence, it is difficult to transfer a substrate to a target position and positioning the substrate at the target position in a stable manner.

SUMMARY OF THE INVENTION

The present invention has been made in consideration of the problems described above and an object thereof is to provide a technique that enables a substrate stopped at a first position to be transferred toward a second position and be stopped at the second position in an accurate and stable manner.

A substrate transfer apparatus according to the present invention is to transfer a substrate stopped at a first position toward a second position and to stop the substrate at the second position. In order to achieve the object described above, the substrate transfer apparatus comprises: substrate transfer means or unit that transfers a substrate along a substrate transfer path extending from the first position to the second position; detection means or unit that detects the substrate at an intermediate position between the first position and the second position when the substrate is traveling along the substrate transfer path; and control means or controller that controls the substrate transfer means. The control means or controller includes a time measurement section and a velocity control section. The time measurement section is to measure an intermediate position arrival time that is required for transferring the substrate from the first position to the intermediate position where the substrate is detected by the detection means. The velocity control section controls a deceleration pattern in accordance with the intermediate position arrival time so that the substrate detected by the detection means is decelerated to stop at the second position.

In another aspect of the present invention is a substrate transfer method adapted to transfer a substrate stopped at a first position toward a second position and to stop the substrate at the second position. In order to achieve the object described above, the substrate transfer method comprises the steps of: measuring an intermediate position arrival time that is required for transferring the substrate from the first position to an intermediate position on a substrate transfer path extending from the first position to the second position; and stopping the transferring substrate at the second position by controlling a deceleration pattern in accordance with the intermediate position arrival time.

These and other objects, features and advantages of the present invention will become more apparent upon reading the following detailed description along with the accompanying drawings.

DESCRIPTION OF THE PREFERRED EMBODIMENTS

Figure 1:
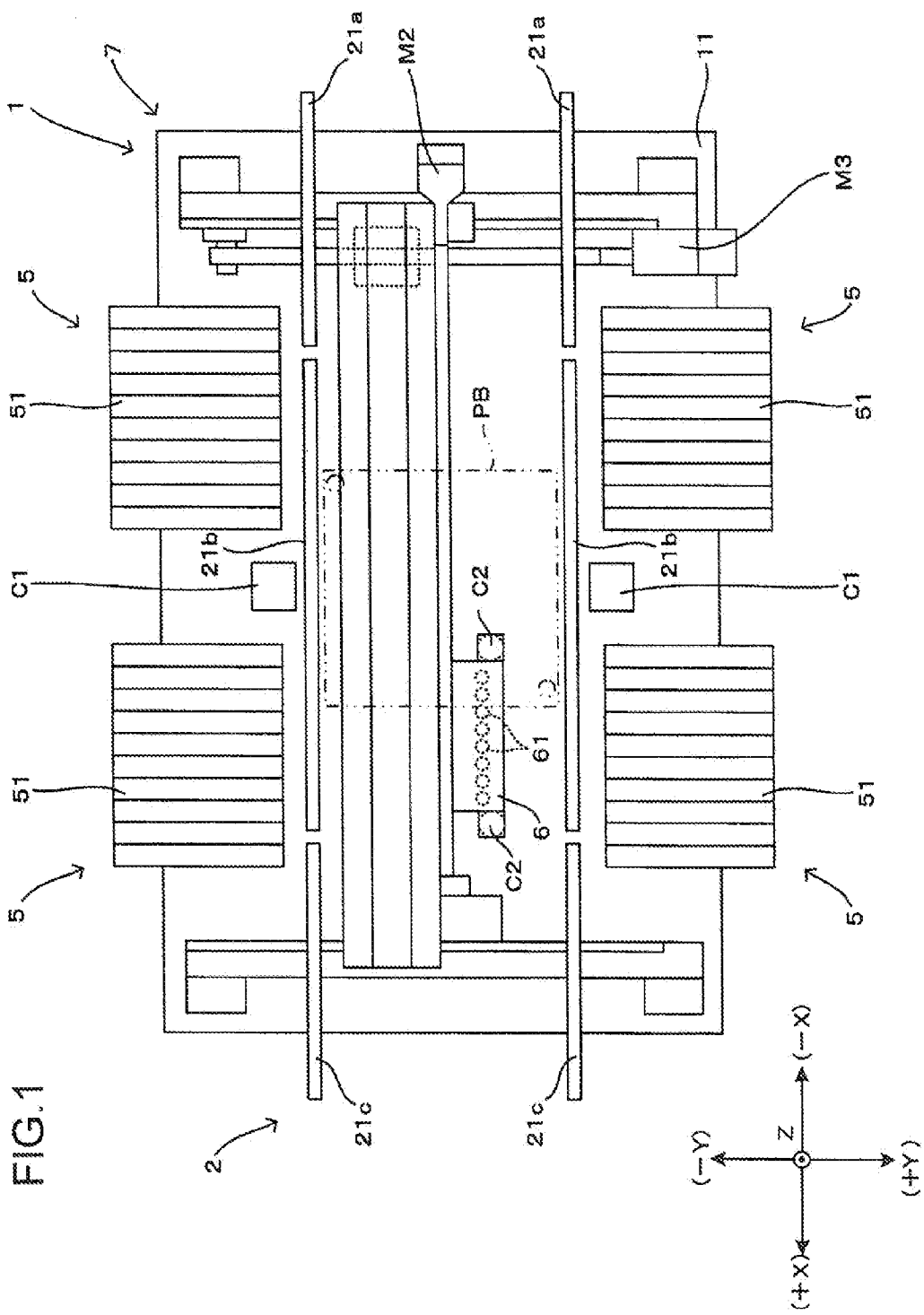
FIG. 1 is a plan view showing a schematic configuration of a surface mounter equipped with a first embodiment of a substrate transfer apparatus according to the present invention.

According to the present invention (substrate transfer apparatus and substrate transfer method), a substrate stopped at a first position will be transferred toward a second position along a substrate transfer path by substrate transfer means. The substrate is then detected at an intermediate position between the first position and the second position by detection means. A measuring step will be carried out to measure an intermediate position arrival time that is a time required for transferring the substrate from the first position to a detecting position where the substrate is detected. The intermediate position arrival time may vary in a case in which substrate transfer deviates from an acceleration/deceleration pattern set in advance occurs, or in a case in which an unexpected factor such as belt deterioration, substrate slippage, or the like occurs during the travels of the substrate from the first position to the substrate detecting position (the intermediate position between the first position and the second position). For example, when a substrate slippage occurs, the intermediate position arrival time would delay accordingly. According to the present invention, the intermediate position arrival time of every substrate is obtained at a timing midst of transferring the substrate which travels from the first position toward the second position. The present invention thus assesses a transfer status of the substrate. A deceleration pattern is then controlled in accordance with the intermediate position arrival time before the substrate is transferred to the second position, so that the substrate stops at the second position accurately. Since each substrate is thus transferred to the second position in a manner under feed-forward control, even if the first substrate, as well as second or subsequent substrates, can always be accurately transferred to the second position. Furthermore, even if the substrate transfer status is unduly changed during a transfer due to an unexpected factor, the status change is accommodated based on the intermediate position arrival time. The substrate transfer is performed along a deceleration pattern in accordance with the intermediate position arrival time. Therefore, the substrate can be transferred to the second position in a stable manner.

"Controlling a deceleration pattern in accordance with an intermediate position arrival time" means, for example, as follows: storing previously an estimated time that is a time estimated to transfer the substrate from the first position to the intermediate position where the substrate is detected by the detection means when the substrate is being transferred toward the second position according to an acceleration/deceleration pattern set in advance in a storage section; and determining a deceleration pattern based on a time difference between the intermediate position arrival time and the estimated time. The estimated time which is previously stored, and a comparison for the time difference between the estimated time with the intermediate position arrival time enable the present invention to determine reliably as to whether the substrate transfer has deviated from an acceleration/deceleration pattern set in advance, or as to whether an unexpected factor such as belt deterioration or substrate slippage has occurred. Such a reliable determination according to the present invention may include quantitative determinations of an amount of deviation, an amount of belt deterioration, an amount of substrate slippage, and the like. Consequently, the substrate can be transferred to and positioned at the second position in a more accurate and stable manner.

Meanwhile, the time difference may substantially nonexistent. In other words, the intermediate position arrival time may exactly match an estimated time. Also the difference between the intermediate position arrival time and the estimated time may be comparable to a measurement error. In such cases, the substrate may be estimated to be transferred exactly according to an acceleration/deceleration pattern set in advance. Therefore, the substrate detected by the detection means should be transferred in accordance with the acceleration/deceleration pattern as originally set in advance. Stable substrate transfer can be performed in this manner.

On the other hand, an unexpected factor such as a slippage of the substrate may also be a cause of a substantial time difference. When it happens, the intermediate position arrival time may become longer than the estimated time in excess of a measurement error range. In order to reliably transfer a substrate to the second position in such a case, it is preferable to set smaller deceleration than the deceleration of an acceleration/deceleration pattern set in advance so that the unexpected factor such as substrate slippage can be prevented previously, thereby transferring the substrate in a more stable manner.

When the substrate detected by the detection means is transferred at smaller deceleration than the deceleration of an acceleration/deceleration pattern set in advance, the transfer time of the substrate detected by the detection means at the second position may be longer than a transfer time in a case where the substrate is transferred according to the acceleration/deceleration pattern set originally in advance. Therefore, in order to accurately stop the substrate at the second position, it is also preferable to hasten the deceleration start timing at which the substrate detected by the detection means is decelerated compared to a deceleration start timing according to the acceleration/deceleration pattern set in advance. By controlling the deceleration start timing and the deceleration in this manner, the deceleration pattern can be controlled with high accuracy and the substrate can also be accurately stopped at the second position.

In addition, a plurality of substrates of a same type may be transferred to the second position in an order set in advance and according to an acceleration/deceleration pattern set in advance. In such a case, a total time required to sequentially transfer the plurality of substrates can be reduced by raising acceleration of an acceleration/deceleration pattern according to which the plurality of substrates are transferred. Following is an example. That is, suppose an (n−1)th (where n is a natural number equal to or greater than 2) substrate is transferred to the second position according to an acceleration/deceleration pattern set in advance. The acceleration/deceleration pattern set in advance may be rewritten into an acceleration/deceleration pattern having greater acceleration than acceleration used for transferring the (n−1)th substrate. An (n)th substrate stopped at the first position is then transferred toward the second position according to the rewritten acceleration/deceleration pattern. Hence, the substrate transfer time can be reduced. Incidentally, if an acceleration/deceleration pattern is rewritten in this manner, then the rewritten acceleration/deceleration pattern should be interpreted as an "acceleration/deceleration pattern set in advance" according to the present invention. It is in fact preferable to update the previous estimated time to a new computed estimated time by computing the new estimated time corresponding to the rewritten acceleration/deceleration pattern whenever an acceleration/deceleration pattern is rewritten as described above.

Furthermore, in order to achieve the object described above, a surface mounter according to the present invention comprises: a component supplying section that supplies components; the substrate transfer apparatus described above; and a head unit. The head unit is adapted to be movable between an upper part of the substrate that is positioned at the second position by the substrate transfer apparatus and an upper part of the component supplying section. The head unit is also adapted to transfer the components supplied from the component supplying section onto the substrate.

With a surface mounter configured as described above, a substrate is accurately transferred to and positioned at the second position in a stable manner. Therefore, mounting of components onto a substrate can be performed smoothly after the substrate is transferred to the second position, and work efficiency of component mounting can be improved.

Detection means may be attached to the head unit. If the detection means is adapted to be integrally movable with the head unit, the detection means can perform two functions: a substrate detection function for optimizing substrate transfer; and a mark detection function for detecting a mark or the like on a substrate. As a result, a sophisticated surface mounter with a small number of components can be obtained.

As described above, the present invention measures an intermediate position arrival time that is required for a substrate to travel from a first position to an intermediate position on a substrate transfer path (a position at which the substrate is detected by detection means). A deceleration pattern by which the substrate is transferred from the intermediate position to a second position is also controlled based on the measurement result to stop the substrate at the second position. Since the substrate is transferred to the second position under feed-forward control as described above, a substrate stopped at the first position can be stopped at the second position in an accurate and stable manner. Hereinafter, a specific description will be given.

Figure 2:
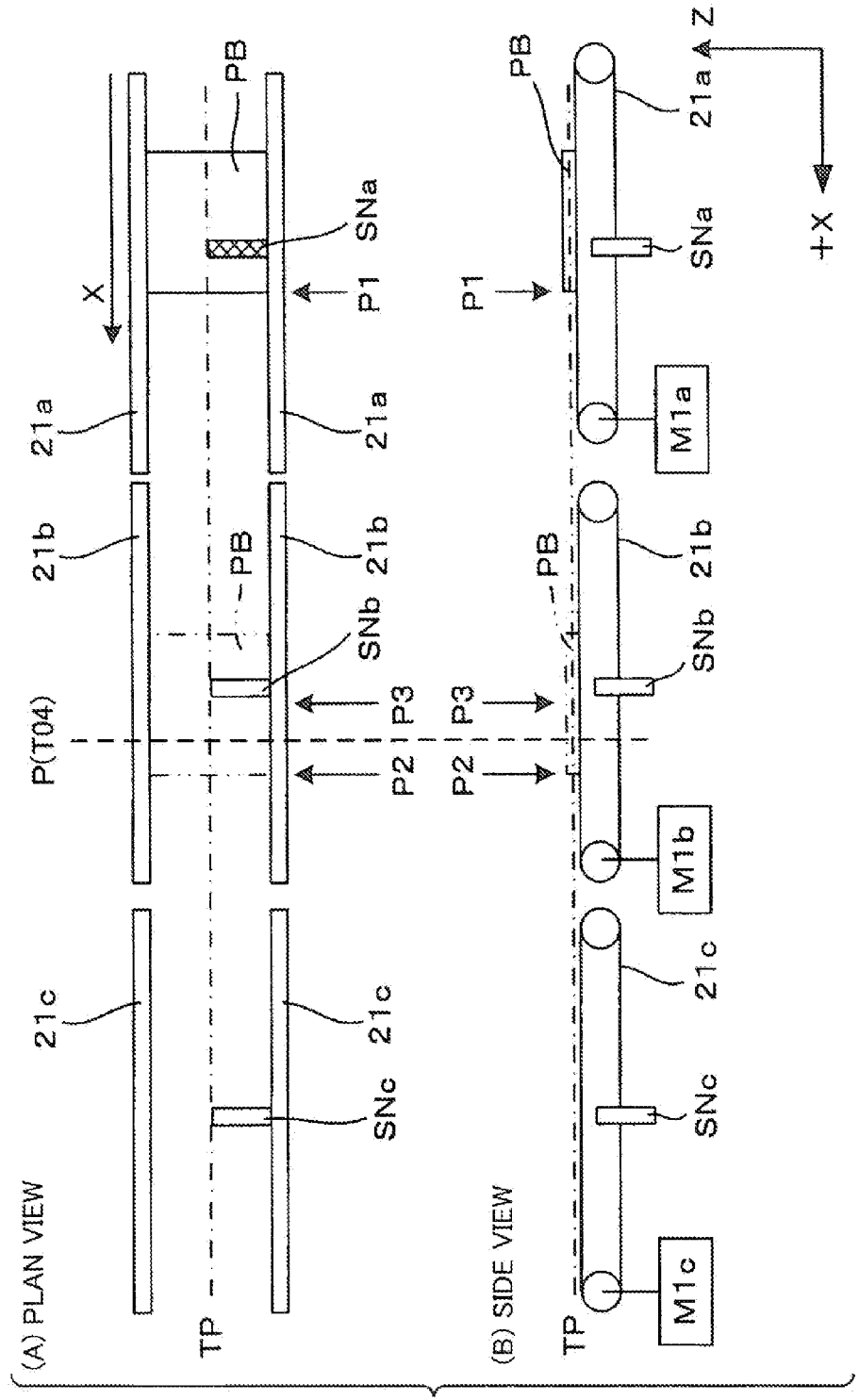
FIG. 2 shows a combination of (A) plan view and (B) side view which schematically show an arrangement relationship between conveyors and sensors in the substrate transfer apparatus.
Figure 3:
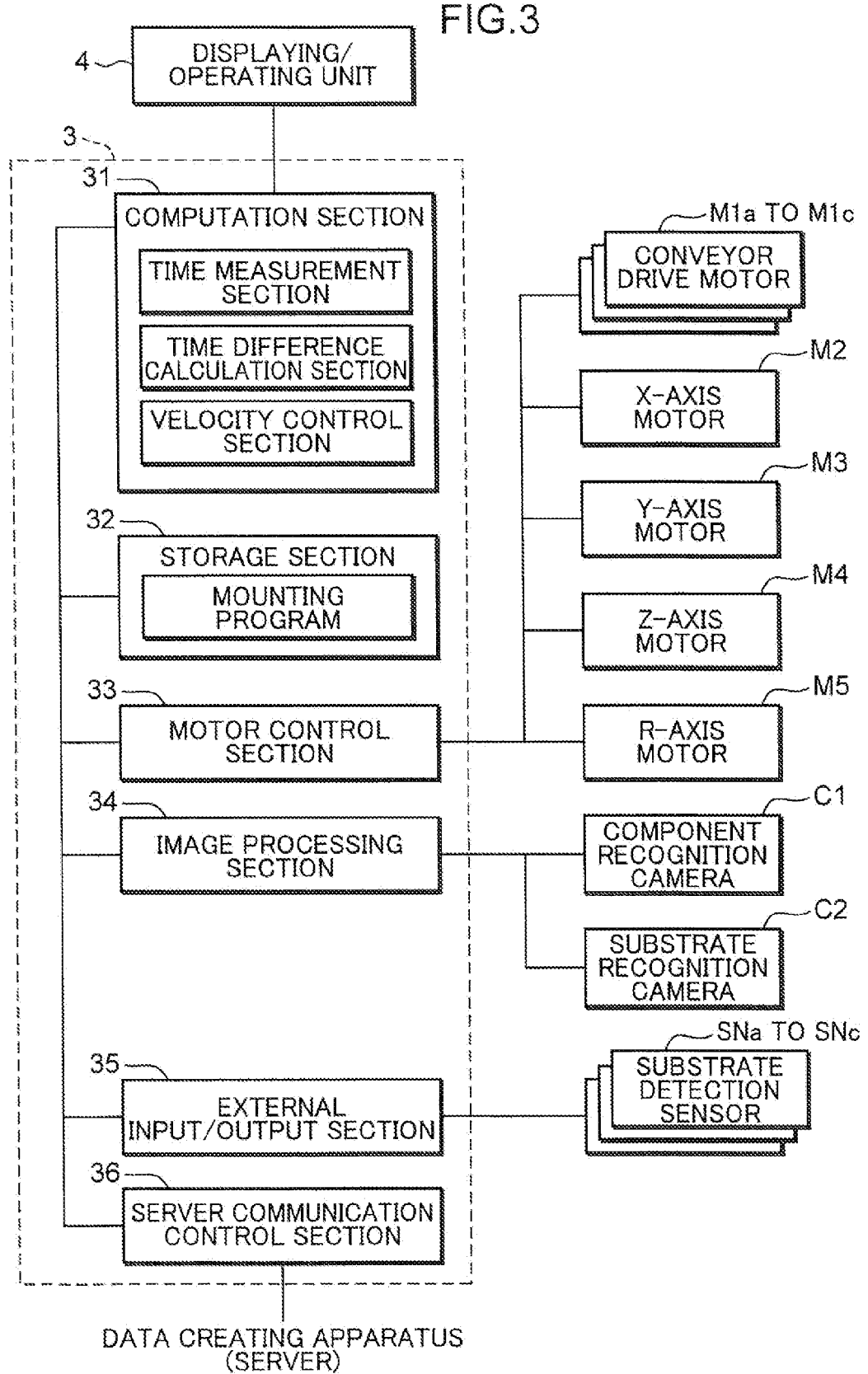
FIG. 3 is a block diagram showing primary electrical components of the surface mounter shown in FIG. 1.

FIG. 1 is a plan view showing a schematic configuration of a surface mounter equipped with a first embodiment of a substrate transfer apparatus according to the present invention. In addition, FIG. 2 is a diagram which schematically shows an arrangement relationship between conveyors and sensors in the substrate transfer apparatus. Furthermore, FIG. 3 is a block diagram showing primary electrical components of the surface mounter shown in FIG. 1. XYZ rectangular coordinate axes are shown in FIGS. 1 and 2 in order to clarify a directional relationship between FIGS. 1 and 2.

In a surface mounter 1, a substrate transfer mechanism 2 corresponding to "substrate transfer means" according to the present invention is arranged on a base 11 and is capable of transferring a substrate PB in a substrate transfer direction X. More specifically, the substrate transfer mechanism 2 comprises three pairs of conveyors arranged on the base 11, and transfer-in conveyors 21a, main transfer conveyors 21b, and transfer-out conveyors 21c are aligned from an upstream side (right hand-side in FIGS. 1 and 2) toward a downstream side (left hand-side in FIGS. 1 and 2) in the substrate transfer direction X such that the substrate PB can be transferred along a substrate transfer path TP from the right hand-side to the left hand-side in FIGS. 1 and 2. In addition, conveyor drive motors M1a, M1b, and M1c are respectively coupled to the conveyors 21a to 21c. By controlling driving by the respective conveyor drive motors M1a, M1b, and M1c with a motor control section 33 of a controller 3 as control means (or a control unit) that controls the entire surface mounter 1, as shown in FIG. 2(A), the substrate PB stopped at a substrate stop position P1 on the transfer-in conveyors 21a is transferred along the substrate transfer path TP toward a work position P2 depicted by a two-dot chain line in FIG. 2 and, furthermore, the substrate PB mounted with components is carried out.

In addition, a substrate detection sensor is fixed and arranged with respect to each pair of conveyors. Specifically, a sensor SNa for detecting the substrate PB prior to carried in is fixed to and arranged at a lower position of the conveyors 21a. The sensor SNa detects the substrate PB which is transferred in the substrate transfer direction X by the conveyors 21a, whereby a substrate detection signal is outputted to the controller 3 via an external input/output section 35. Moreover, in FIG. 2 (and in FIG. 4 afterwards), cross hatching is applied when the sensor SNa (and a sensor SNb to be described later) is in a state in which the substrate PB is being detected, and cross hatching is not applied in a state in which the substrate PB is not being detected.

A computation section 31 of the controller 3 controls the conveyor drive motor M1a via the motor control section 33 after the substrate PB is detected by the substrate detection sensor SNa. The substrate PB is then transferred over a given distance. Further the substrate PB is stopped at a substrate stop position (which corresponds to a "first position" according to the present invention) P1 which is located frontward of the substrate detection sensor SNa by a predetermined distance in the substrate transfer direction X as shown in FIG. 2. Moreover, in the present specification, a tip position of the substrate PB is used as a reference when pinpointing a location of the substrate PB.

A sensor SNb for detecting the substrate PB being transferred toward a mounting work position (a position of the substrate PB depicted by a two-dot dashed line in FIGS. 1 and 2) which corresponds to a "second position" according to the present invention is fixed and arranged at a lower position of the conveyors 21b that is under an intermediate position P3 between the substrate stop position P1 and the mounting work position P2. Upon detection of the substrate PB which is transferred to the intermediate position P3, the sensor SNb outputs a substrate detection signal to the controller 3 via the external input/output section 35. Subsequently, the computation section 31 of the controller 3 performs various computations based on the detection of the substrate by the substrate detection sensor SNb. The computation section 31 also control, at the same time, the conveyor drive motor M1b via the motor control section 33 based on the computation result to transfer the substrate PB detected by the sensor SNb to, and stop the substrate PB at, the mounting work position P2. This operation will be described in detail later.

The conveyors 21c and 21c are provided at the lower portions with a sensor SNc. The sensor SNc is arranged for detecting a so-called component-mounted substrate PB delivered from the mounting work position P2. The component-mounted substrate PB is a substrate onto which components are mounted at the mounting work position P2. Upon detection of the component-mounted substrate PB, the sensor SNc output a substrate detection signal to the controller 3 via the external input/output section 35. In the present embodiment, the three sensors SNa to SNc are provided so as to enable detection of a current position, a transfer velocity, and the like of a substrate PB which is transferred by the substrate transfer mechanism 2. In particular, in the present invention, a deceleration start timing and the deceleration of the substrate PB are controlled in accordance with the detection of the substrate PB by the sensor SNb in order to transfer the substrate PB to the mounting work position P2 in an accurate and stable manner.

The substrate PB stopped at the mounting work position P2 in this manner is fixed and held by a holding apparatus (not shown). Subsequently, electronic components (not shown) supplied from the component housing section 5 are mounted onto the substrate PB by a suction nozzle 61 installed in plurality on the head unit 6. After the surface mounter 1 completes the mounting operations for all components to be mounted on the substrate PB where the head unit 6 travels back in forth a plurality of times between an upper part of a tape feeder 51 installed on the component housing section 5 and an upper part of the substrate PB in this manner, the conveyor drive motors M1*b* and M1*c* of the substrate transfer mechanism 2 are activated in response to a drive command from the controller 3 and transfers the substrate PB.

The component housing section 5 as described above is arranged on both sides of the substrate transfer mechanism 2 in a Y-axis direction. One or a plurality of tape feeders 51 are attachable to each of the component housing sections 5. In addition, a reel (not shown) around which is wound a tape that houses and holds electronic components at a constant pitch is arranged in the component housing section 5 in correspondence with each feeder 51, and the component housing section 5 is capable of supplying electronic components using each feeder 51. Moreover, in the present embodiment, the component housing section 5 is provided at a total of four locations, namely, upstream portions and downstream portions on front (+Y) sides and rear (−Y) sides of the main transfer conveyors 21*b*. Each component housing section 5 is installed with an appropriate feeder 51 by an operator in accordance with mounting of components to the substrate PB that is performed based on a mounting program.

In addition to the substrate transfer mechanism 2, the surface mounter 1 is provided with a head drive mechanism 7. The head drive mechanism 7 is a mechanism for moving the head unit 6 in an X-axis direction and a Y-axis direction in a predetermined range of the base 11, and an X-axis motor M2 and a Y-axis motor M3 are respectively used for movement in the X-axis direction and the Y-axis direction. In addition, an electronic component suctioned by the suction nozzle 61 due to the movement of the head unit 6 is transferred from an upper position of the component housing section 5 to an upper position of the substrate PB. In other words, in this head unit 6, eight mounting heads (not shown) extended in a vertical direction Z are arranged in a row at regular intervals in the X-axis direction (a direction in which the substrate PB is transferred by the substrate transfer mechanism 2). Furthermore, the suction nozzle 61 is attached to a tip of each mounting head.

Each mounting head can be elevated and lowered (moved in a Z-axis direction) with respect to the head unit 6 by a nozzle elevation drive mechanism that uses a Z-axis motor M4 as a drive source, and can be rotated around a nozzle central axis by a nozzle rotation drive mechanism that uses an R-axis motor M5 as a drive source. Among these drive mechanisms, the nozzle elevation drive mechanism elevates and lowers a mounting head between a lowered position at which suction or mounting is performed and a raised position at which transfer or imaging is performed. On the other hand, the nozzle rotation drive mechanism is a mechanism for rotating a component suction nozzle to conform to an electronic component mounting direction, to correct a suction deviation in the R-axis direction, and the like, and is capable of positioning an electronic component in a predetermined R-axis position during mounting by driving rotation.

The head unit 6 is moved by the head drive mechanism 7 to an upper part of the component housing section 5. The suction nozzle 61 is positioned by the Z-axis motor M4 to an upper part of a component suction position of the feeder 51 that mounts a suction target component. The suction nozzle 61 is lowered and the tip of the suction nozzle 61 comes into contact with an electronic component supplied from the component housing section 5 in order to suction and pickup the electronic component. The suction nozzle 61 rises, then. In this manner, the head unit 6 is transferred to an upper part of the substrate PB while an electronic component is being suctioned and held by the suction nozzle 61, and the electronic component is mounted onto the substrate PB at a predetermined position in a predetermined direction.

In the midst of transferring, the head unit 6 passes above a component recognition camera C1 arranged in the middle in the X direction of two component housing sections 5 on the side of the transfer path. The component recognition camera C1 captures an image of the electronic component suctioned by each suction nozzle 61 from below. As a result, a suction deviation at each suction nozzle 61 is detected and position correction corresponding to the suction deviation is performed when transferring each electronic component onto the substrate PB.

In addition, substrate recognition cameras C2 are respectively fixed to both sides of the head unit 6 in the X-axis direction. When the head drive mechanism 7 moves the head unit 6 in the X-axis direction and the Y-axis direction, these cameras C2 can capture an image of the substrate PB from above at any position. To this end, each substrate recognition camera C2 performs image recognition of a substrate position and a substrate direction by photographing a plurality of fiducial marks attached to the substrate PB at the mounting work position.

The controller 3 that controls the entire surface mounter 1 configured as described above comprises the computation section 31, a storage section 32 that includes a ROM, a RAM, or an external storage device such as a hard disk drive, the motor control section 33, an image processing section 34, the external input/output section 35, and a server communication control section 36. Among these components, the computation section 31 is constituted by a CPU and other components.

The computation section 31 functions as:

a time measurement section that measures a period of time required for transferring the substrate PB from a substrate stop position P1 to a position (hereinafter referred to as an "intermediate position arrival time") where the substrate PB being transferred thereto is detected by the sensor SNb;

a time difference calculation section that calculates a time difference between an intermediate position arrival time (which corresponds to an "estimated time" to be described later) that is expected when transferring the substrate PB according to an acceleration/deceleration pattern set in advance (FIGS. 6(A) and 6(C)) and an intermediate position arrival time actually measured by the time measurement section; and a velocity control section that controls a transfer velocity of the substrate PB.

In addition, the computation section 31 controls respective sections of the surface mounter 1 according to a mounting program written to the storage section 32 to perform component mounting.

Besides the mounting program, the storage section 32 stores various information (a standard acceleration $a0$, a standard acceleration time, transfer velocity $V1$, a deceleration start timing $T04$, the deceleration $b0$, and the like) for identifying a standard acceleration/deceleration pattern to be used for transferring a first substrate of a lot, an intermediate position arrival time estimated value ET, a minimum value and a maximum value of transfer acceleration (acceleration $a$ and deceleration $b$), a minimum value and a maximum value of transfer velocity, and the like.

Let us now return to and continue the description of the electrical configuration of the surface mounter 1. As shown in FIG. 3, the conveyor drive motors M1*a* to M1*c*, the X-axis motor M2, the Y-axis motor M3, the Z-axis motor M4, and the R-axis motor M5 are electrically connected to the motor control section 33. Driving of each motor is controlled by the motor control section 33.

In addition, the component recognition camera C1 and the substrate recognition camera C2 are electrically connected to the image processing section 34. Imaging signals outputted from the respective cameras C1 and C2 are acquired by the image processing section 34. Based on the acquired imaging signals, the image processing section 34 analyzes both component images and substrate images.

A displaying/operating unit 4 is provided for the surface mounter 1 to display the mounting program, component information, and the like. The displaying/operating unit 4 is also used by an operator to input information such as various data including maximum and minimum values of transfer acceleration and transfer velocity, and commands into the controller 3. Furthermore, the surface mounter 1 is provided with the server communication control section 36 for sending and receiving a mounting program and various data such as component information to/from a data creating apparatus (server) that creates the mounting program as well as other surface mounters.

Next, a description of an outline of an operation of transferring a first substrate PB among a lot including a plurality of substrates PB to the mounting work position P2 in the surface mounter 1 configured as described above will be given with reference to FIGS. 4 to 6. The following description explains two cases: a case in which substrate slippage or the like does not occur and the transfer is performed as estimated (in other words, according to an acceleration/deceleration pattern set in advance); and a case in which a lag in substrate transfer occurs due to a factor such as belt deterioration, substrate slippage, or the like and the transfer is not performed as estimated. Subsequently, a substrate transfer method according to the present embodiment will be described with further reference to FIGS. 7 and 8.

Figure 4:
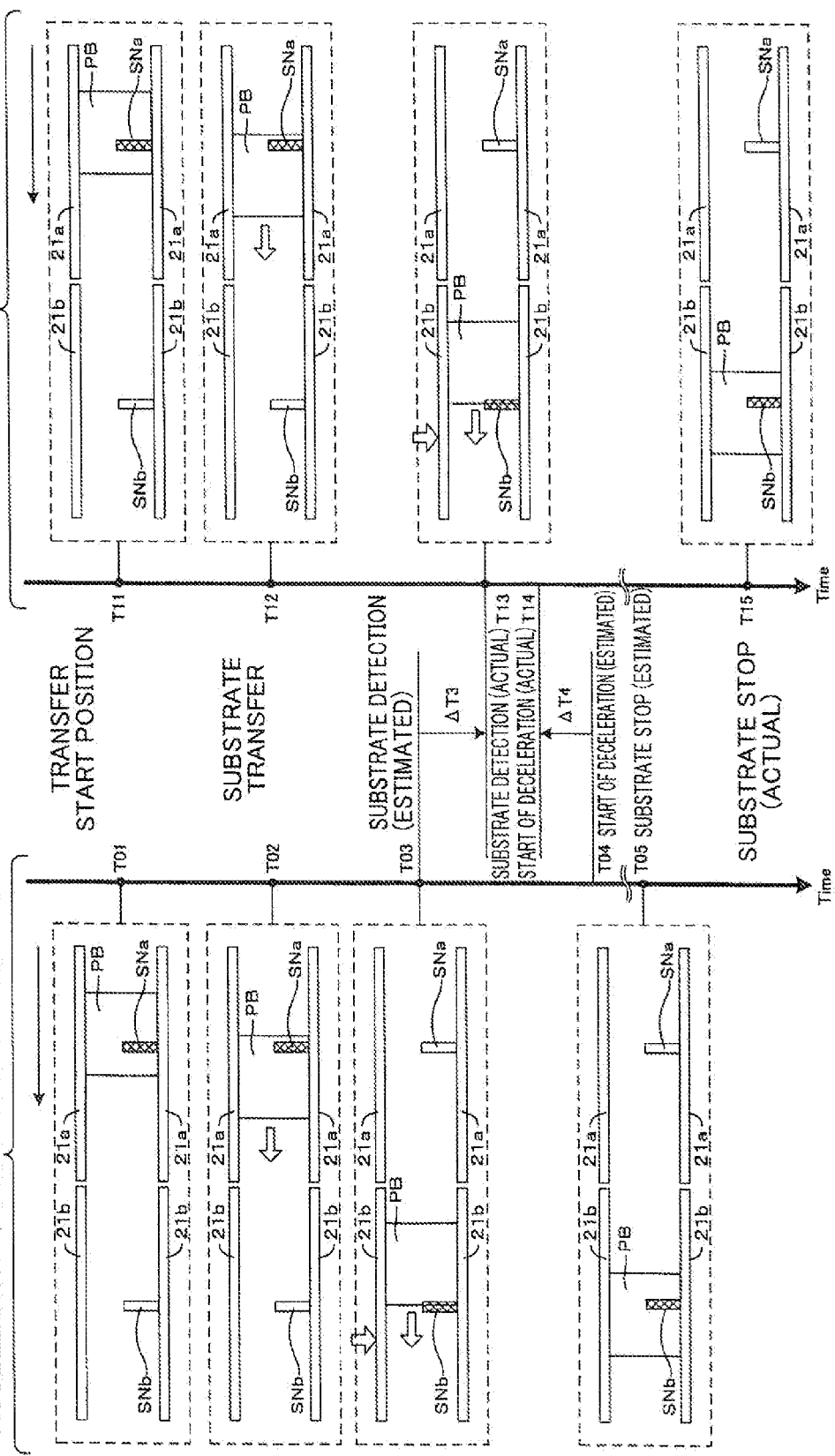
FIG. 4 is a plan view schematically showing an outline of substrate transfer by the surface mounter shown in FIG. 1.
Figure 5:
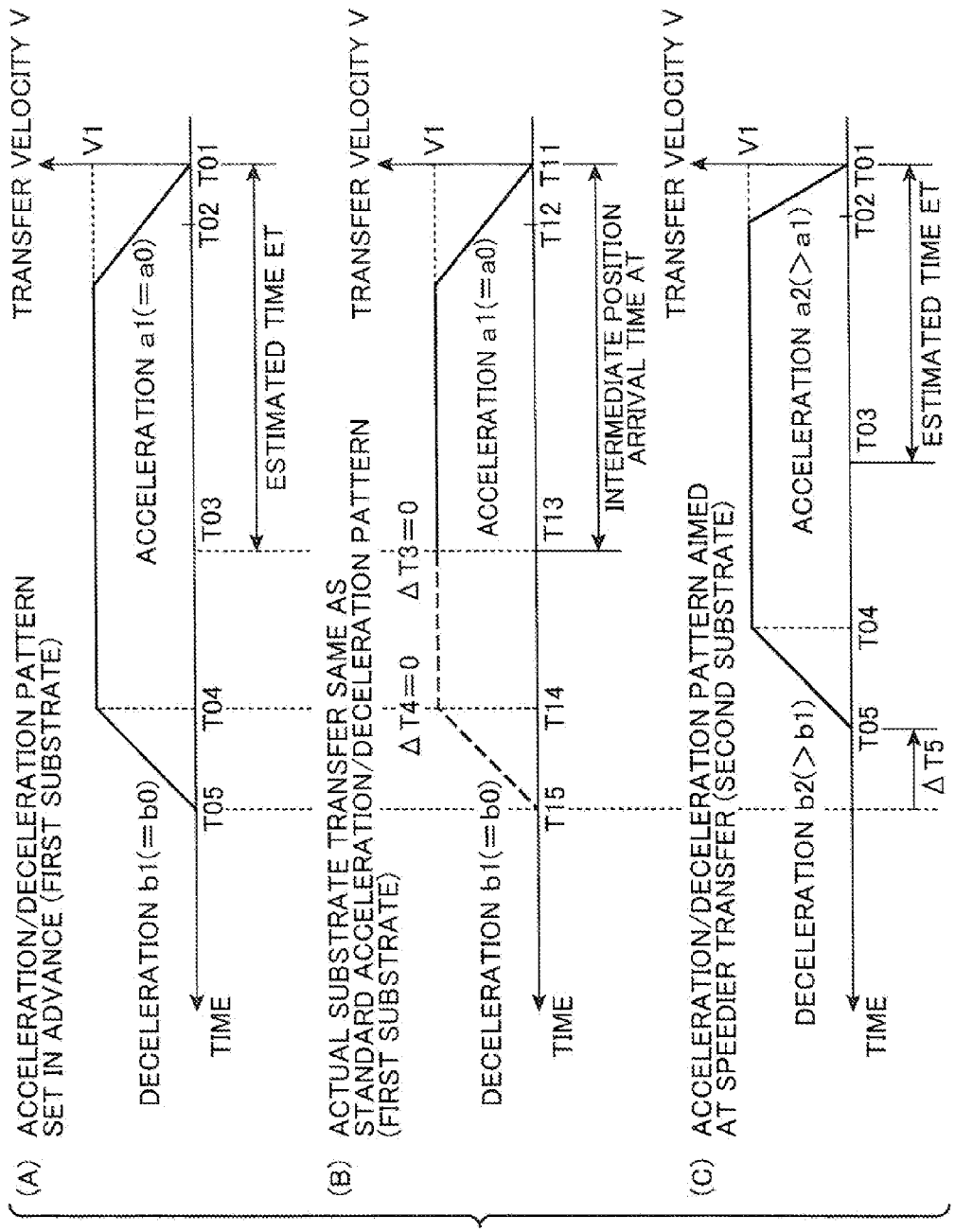
FIG. 5 is a timing chart showing acceleration/deceleration patterns of a substrate when the substrate is transferred as estimated by the surface mounter shown in FIG. 1.
Figure 6:
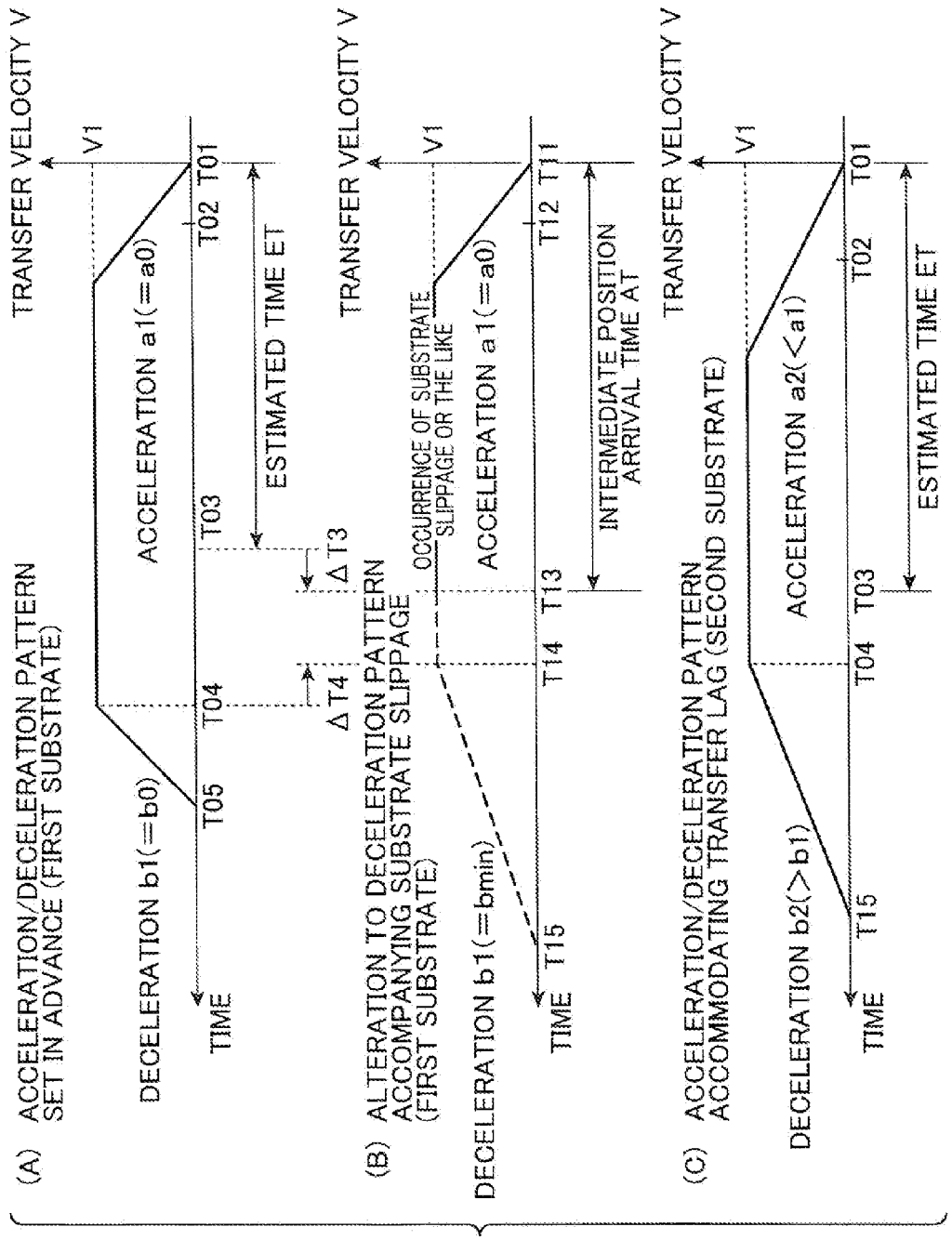
FIG. 6 is a timing chart showing acceleration/deceleration patterns of a substrate when the substrate is not transferred as estimated by the surface mounter shown in FIG. 1.

FIG. 4 is a diagram schematically showing an outline of substrate transfer by the surface mounter shown in FIG. 1. In addition, FIG. 5 is a timing chart showing acceleration/deceleration patterns (A) to (C) of a substrate when the substrate is transferred as estimated by the surface mounter shown in FIG. 1. Furthermore, FIG. 6 is a timing chart showing acceleration/deceleration patterns (A) to (C) of a substrate when the substrate is not transferred as estimated by the surface mounter shown in FIG. 1. As shown, when transferring the first substrate PB, a standard acceleration/deceleration pattern is read from the storage section 32 and is assumed as being the "acceleration/deceleration pattern set in advance", and substrate transfer is performed according to this acceleration/deceleration pattern (FIGS. 5(A) and 6(A)). In FIGS. 5 and 6, reference characters T01, T02, T03, T04, and T05 denote representative motion timings according to the acceleration/deceleration pattern set in advance, and reference characters T11, T12, T13, T14, and T15 denote actual motion timings corresponding to the motion timings T01, T02, T03, T04, and T05 when the substrate PB is actually transferred according to the acceleration/deceleration pattern. In other words, when substrate transfer is performed according to the acceleration/deceleration pattern set in advance, the actual motion timings T11, T12, T13, T14, and T15 are respectively consistent with the motion timings T01, T02, T03, T04, and T05.

In addition, the diagram shown in a left half in FIG. 4 is an estimation diagram of a substrate transfer operation in a case in which the first substrate PB is transferred according to the standard acceleration/deceleration pattern, and shows a transfer status of the substrate PB and an ON/OFF status of the sensors SNa and SNb at each of the motion timings T01, T02, T03, and T05. In addition, the motion patterns thereof are as shown in FIG. 5(B). On the other hand, the diagram shown in a right half in FIG. 4 is a prediction diagram of an actual substrate transfer operation in a case in which the first substrate PB is not transferred according to the standard acceleration/deceleration pattern, and shows a transfer status of the substrate PB and an ON/OFF status of the sensors SNa and SNb at each of the motion timings T11, T12, T13, and T15. The motion patterns thereof are as shown in FIG. 6(B).

With the surface mounter 1, when a detection signal indicating a detection of the substrate PB is outputted from the sensor SNa, the controller 3 decelerates a transfer velocity V of the conveyors 21a to stop the substrate PB at a substrate stop position P1 that is located frontward of a position where the substrate PB had been detected by the sensor SNa by a predetermined distance (timings T01 and T11). In this manner, the controller 3 causes the substrate PB to stand by at the substrate stop position P1 until preparation to start mounting components to the substrate PB is completed.

When mounting of components to the first substrate PB on stand by becomes possible, the controller 3 controls the respective sections of the apparatus according to the mounting program, and transfers the substrate PB to and positions the substrate PB at the mounting work position P2 according to the acceleration/deceleration pattern set in advance. At this point, when a transfer lag due to a factor such as conveyor deterioration or substrate slippage does not occur, as shown in the left half of FIG. 4 and in FIG. 5(B), the first substrate PB is transferred according to the acceleration/deceleration pattern set in advance. In other words, the transfer-in conveyors 21a and the main transfer conveyors 21b are driven to transfer the substrate PB at an acceleration a1 (=a standard acceleration a0) (timing T12). Once the transfer velocity V reaches a transfer velocity V1, the substrate PB is transferred at a constant velocity. Subsequently, the controller 3 decelerates the substrate PB at deceleration b1 (=standard deceleration b0) at the timing T14, and stops the substrate PB at the mounting work position P2 at the timing T15.

As long as a factor such as conveyor deterioration or substrate slippage does not occur, the timings T11, T12, T13, T14, and T15 are completely consistent with respectively corresponding timings T01, T02, T03, T04, and T05, and the substrate PB can be transferred to the mounting work position P2 in an accurate and stable manner. However, for example, when a transfer lag occurs due to substrate slippage as shown in FIG. 6(B), transferring the substrate PB at the standard acceleration/deceleration pattern as-is results in the substrate PB stopped before reaching the mounting work position P2.

Hence, in the present embodiment, the substrate PB is detected by the sensor SNb at the intermediate position P3 during the transfer of the substrate PB from the substrate stop position P1 to the mounting work position P2, and a deceleration pattern is controlled based on the detection result. Specifically, when the tip of the substrate PB reaches a position P3 directly above the sensor SNb, a detection signal signifying detection of the substrate PB is supplied from the sensor SNb to the controller 3 (timing T13). With the surface mounter 1 configured as described above, when the substrate PB is being transferred according to the standard acceleration/deceleration pattern as shown in FIG. 5(B), a period of time required for transferring the substrate PB from the substrate stop position P1 to the intermediate position P3, or the intermediate position arrival time AT, where the substrate PB is detected by the sensor SNb becomes equal to a given estimated time ET (=T03−T01). In other words, a time difference ΔT3 (=T13−T03) between the intermediate position arrival time AT and the estimated time ET when the arrival of the substrate PB at the position P3 directly above the sensor SNb is zero. On the other hand, there is likelihood that an unexpected factor such as belt deterioration or substrate slippage may occur, for example, as shown in the right half of FIG. 4 and in FIG. 6(B). In such a case, the transfer will not be performed according to the standard acceleration/deceleration pattern, so that the intermediate position arrival time AT (=T13−T11) becomes longer than the estimated time ET by the time difference ΔT3. Therefore, occurrence of an unexpected factor can be verified based on the time difference ΔT3.

In addition, if substrate slippage or the like occurs during transfer of the substrate PB to the intermediate position P3, substrate slippage may also occur when transferring the substrate PB at the standard deceleration b0. In such a case, the substrate PB may stop before the mounting work position P2. Hence, it is preferable to alter the deceleration b1 to a value that is smaller than the deceleration b1 of the acceleration/deceleration pattern set originally in advance, when an occurrence of an unexpected factor is verified based on a comparison result of the intermediate position arrival time AT and the estimated time ET as described above. Although a transfer time required for transferring the substrate PB from the position P3 directly above the sensor SNb to the mounting work position P2 increases slightly, such an alternation in the deceleration b1 enables the substrate PB to be accurately positioned and stopped at the mounting work position P2, yet reliably preventing slippage of the substrate PB. In the present embodiment, to accommodate the alternation of the deceleration b1 to a smaller value than the standard deceleration b0, the deceleration start timing T14 is set earlier than the deceleration start timing T04 of the standard acceleration/deceleration pattern by a time difference ΔT4, as shown in FIG. 6(B). As described above, in the present embodiment, a deceleration pattern (the dashed line in FIG. 6(B)) is controlled by altering the deceleration start timing T14 and the deceleration b1 to accurately stop and position the substrate PB at the mounting work position P2. When the substrate PB which is transferred to the intermediate position P3 at the transfer velocity V1 is transferred according to the deceleration pattern (the deceleration start timing T14 and the deceleration b1) and stopped at the mounting work position P2 in this manner, a distance D over which the substrate PB is transferred according to the deceleration pattern is expressed as $$D = (T04 - T03 - \Delta T3 - \Delta T4) \times V1 + \frac{V1^2}{(2 \times b1)}. \quad (1)$$

This distance D represents a distance from the intermediate position P3 to the mounting work position P2 and is a fixed value. Therefore, by transforming the expression above, the time difference ΔT4 may be expressed as $$\Delta T4 = (T04 - T03 - \Delta T3) + \frac{V1}{(2 \times b1)} - \frac{D}{V1}. \quad (2)$$

Moreover, while the first substrate PB is illustrated in FIGS. 4 to 6, the second and subsequent substrates PB are subjected to basically the same processing.

As described above, in the present embodiment, an intermediate position arrival time AT is measured while the substrate PB is being transferred from the substrate stop position P1 toward the mounting work position P2 and a transfer status of the substrate PB (whether or not an unexpected factor has occurred) is assessed based on the intermediate position arrival time AT. In addition, before transferring the substrate PB to the mounting work position P2, the deceleration pattern is controlled by altering control parameters (a deceleration start timing and the deceleration) in accordance with the intermediate position arrival time AT in order to accurately stop and position the substrate PB at the mounting work position P2. Since the substrate PB is transferred to the mounting work position P2 under feed-forward control in this manner, the substrate PB can always be accurately transferred to the mounting work position P2 regardless of the substrate PB being the first substrate PB or a second or subsequent substrate PB. Furthermore, even if the substrate transfer status is changed during a transfer due to an unexpected factor, the status change is assessed based on the intermediate position arrival time AT and substrate transfer is performed in accordance with the intermediate position arrival time AT. Therefore, the substrate PB can be transferred to the mounting work position P2 in a stable manner.

As shown in FIGS. 5(C) and 6(C), in the present embodiment, once transfer of the first substrate is completed, the acceleration/deceleration pattern is updated before transfer of the second substrate. This update is intended to reduce a substrate transfer time of the second substrate. Details of an operation thereof will be described below together with a specific control flow of the operation.

Figure 7:
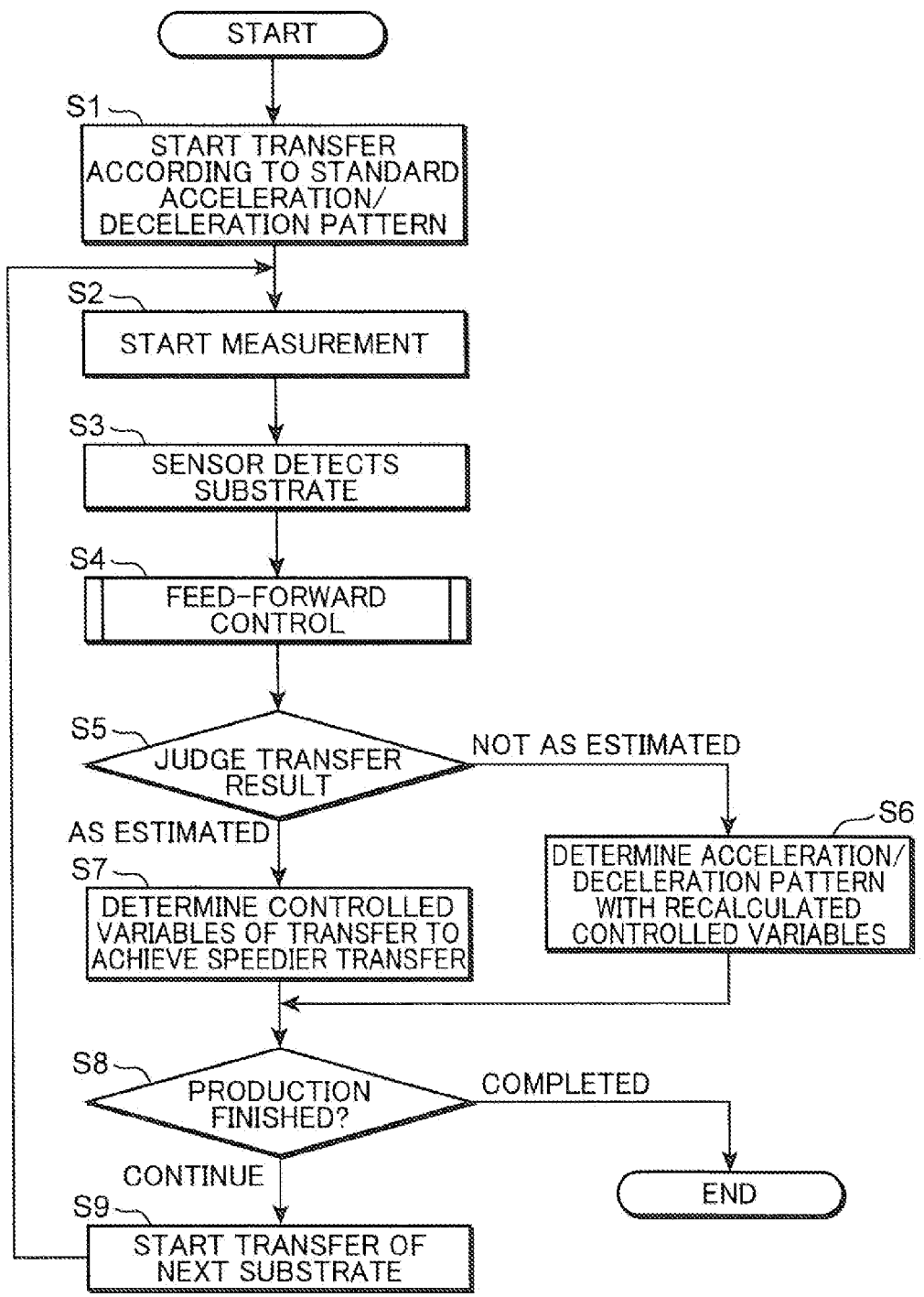
FIG. 7 is a flow chart showing operations of the surface mounter shown in FIG. 1.
Figure 8:
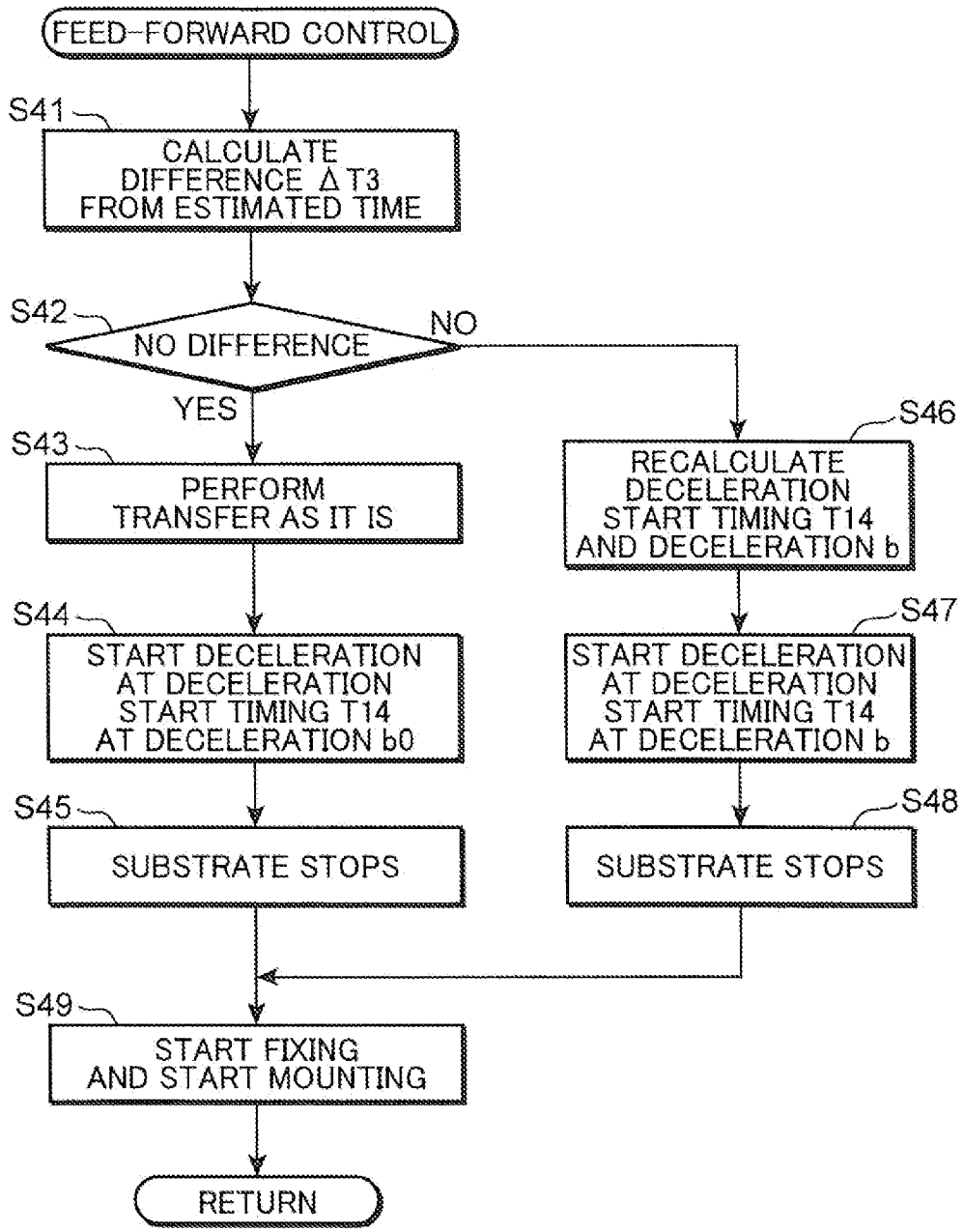
FIG. 8 is a flow chart showing feed-forward control.

FIG. 7 is a flow chart showing operations of the surface mounter shown in FIG. 1. In addition, FIG. 8 is a flow chart showing feed-forward control. The controller 3 controls the respective sections of the apparatus according to a mounting program stored in the storage section 32. Basically, the controller 3 is adapted to exert a component mounting operation by transferring a first substrate PB of a lot, which is standing by at the substrate stop position P1. The first substrate PB is transferred to the mounting work position P2 according to the standard acceleration/deceleration pattern, as shown in FIG. 5(A) or 6(A). Therefore, in step S1, the computation section 31 of the controller 3 activates the respective conveyor drive motors M1a and M1b via the motor control section 33 to start transfer of the substrate PB according to the standard acceleration/deceleration pattern (timing T11). In addition, at the same time the transfer is started, the computation section 31 starts measuring elapsed time in order to obtain an intermediate position arrival time AT (step S2). Subsequently, when the substrate PB arrives at the position P3 directly above the sensor SNb and a detection signal is outputted from the sensor SNb (step S3), the computation section 31 establishes the intermediate position arrival time AT and performs feed-forward control (step S4).

As shown in FIG. 8, in this feed-forward control, the computation section 31 calculates a time difference ΔT3 of the intermediate position arrival time AT from the estimated time ET (step S41) and judges whether or not the time difference ΔT3 is substantially nonexistent (step S42). The term "time difference ΔT3 is substantially nonexistent" here means that the time difference ΔT3 is within an allowable range including a measurement error and the like and that the time difference ΔT3 is substantially zero when error is taken into consideration. When such a judgment is made, the computation section 31 maintains the acceleration/deceleration pattern set in advance (the standard acceleration/deceleration pattern for the first substrate PB, and an acceleration/deceleration pattern rewritten as will be described later for the second and subsequent substrates PB) (step S43). Subsequently, the deceleration is started at a deceleration start timing T14 that is consistent with a timing T04 of the acceleration/deceleration pattern set in advance (step S44). The deceleration b at this point is equal to the deceleration b0, and the substrate PB is stopped and positioned at the mounting work position P2 at a timing T15 (step S45). In this manner, the substrate PB is accurately transferred to the mounting work position P2 according to the acceleration/deceleration pattern set in advance.

On the other hand, when the time difference ΔT3 substantially exists (exceeds the allowable range) in step S42, the computation section 31 advances a deceleration start timing T14 by a period of time ΔT4 from the deceleration start timing T04 of the acceleration/deceleration pattern set in advance (the standard acceleration/deceleration pattern for the first substrate PB, and an acceleration/deceleration pattern rewritten as will be described later for the second and subsequent substrates PB), and changes the deceleration pattern by altering the deceleration b (step S46). Moreover, in the present embodiment, a mode of alteration of the deceleration b is differentiated according to whether the substrate PB is a first substrate or a second or subsequent substrate of a lot. That is, when the substrate PB is the first substrate, the deceleration b is altered to a value smaller than the deceleration b0 or, more specifically, to the deceleration b min at which slippage of the substrate PB does not occur. In addition, for the second and subsequent substrates, while the deceleration may be uniformly set to the deceleration b min, in the present embodiment, the deceleration b of the second and subsequent substrates is set higher than the deceleration b min as shown below in order to reduce transfer time while suppressing occurrences of substrate slippage and the like. Specifically, for an (n)th substrate (where n is a natural number equal to or greater than 2), if "bn–1" denotes the deceleration of an (n–1)th substrate, then $$b = \frac{(b0 + bn - 1)}{2} \quad (3)$$

is satisfied.

Deceleration is started at the deceleration start timing T14 altered as described above (step S47), and the transfer velocity of the substrate PB is decelerated at the altered deceleration b to stop and position the substrate PB at the mounting work position P2 (step S48).

Once the substrate PB is accurately positioned at the mounting work position P2 as described above, the substrate PB is fixed and held by a holding apparatus (not shown). Subsequently, electronic components (not shown) supplied from the component housing section 5 are mounted onto the substrate PB fixed at the mounting work position P2 by the suction nozzle 61 installed in plurality on the head unit 6 (step S49). After the head unit 6 travels back in forth a plurality of times between an upper part of the component housing section 5 and an upper part of the substrate PB in this manner and the surface mounter 1 completes mounting of all components to be mounted on the substrate PB, the conveyor drive motors M1b and M1c are activated in response to a drive command from the computation section 31 and to transfer the substrate PB.

Let us now return to FIG. 7 to continue the description of the operation. The computation section 31 judges whether or not the substrate has been transferred under feed-forward control (step S4) as expected and substantially without any time difference ΔT3 or, in other words, without an occurrence of a transfer lag and according to the acceleration/deceleration pattern set in advance (step S5). When the computation section 31 judges that there is a discrepancy from what was estimated (in other words, that a transfer lag is to occur according to the acceleration/deceleration pattern set in advance), controlled variables (the acceleration a0, the deceleration start timing T04, and the deceleration b0) that define an acceleration/deceleration pattern are reset based on a result of the recalculation performed in step S46, and the acceleration/deceleration pattern (FIG. 6(C)) is rewritten as a new "acceleration/deceleration pattern set in advance". For example, when substrate slippage or the like occurs during transfer of the first substrate as shown in FIG. 6(C), an acceleration of the acceleration/deceleration pattern according to which the second substrate PB is transferred may be set to the acceleration a2 (<a1) and the deceleration may be set to the deceleration b2 (<b1), and the acceleration a2 and the deceleration b2 may be rewritten as the "acceleration/deceleration pattern set in advance" according to the present invention to prevent substrate slippage or the like from occurring during transfer of the second substrate. In step 6, the estimated time ET is updated after the calculation in a case where a substrate is transferred according to the "acceleration/deceleration pattern set in advance" that has been rewritten in this manner.

On the other hand, when the computation section 31 judges that there is no discrepancy from what was estimated, in order to achieve speedier transfer, the computation section 31 newly determines controlled variables (an acceleration, a deceleration start timing, and the deceleration) and rewrites the acceleration/deceleration pattern and, at the same time, obtains an estimated time ET when a substrate is transferred according to the rewritten acceleration/deceleration pattern and updates the estimated time ET (step S7). At this point, a new acceleration an may be determined as follows. That is, while the first substrate PB is accelerated at an acceleration a1 (=a standard acceleration a0), (n)th and subsequent substrates PB (where n is a natural number equal to or greater than 2) may be set to a value greater than the acceleration (an–1) of an immediately previous substrate, and an acceleration an of the (n)th substrate PB may be determined based on the following expression:

$$an = \frac{(a\max + an - 1)}{2}, \quad (4)$$

where 'a max' denotes an upper limit of acceleration which is a value determined according to apparatus configuration. In addition, in a similar manner to the acceleration an, the deceleration bn may also be set to a value greater than the deceleration (bn–1) of an immediately previous substrate, and the deceleration bn of the (n)th substrate may be determined based on the following expression:

$$b = \frac{(b\max + bn - 1)}{2}, \quad (5)$$

where b max denotes an upper limit of the deceleration which is a value determined according to apparatus configuration.

An acceleration/deceleration pattern rewritten as described above corresponds to an "acceleration/deceleration pattern set in advance" according to the present invention. Once the acceleration/deceleration pattern is rewritten and the estimated time ET is reset, in a next step S8, the computation section 31 judges whether or not component mounting has been completed for all substrates PB included in the lot. When there is a substrate PB not yet mounted and production is to be continued, the rewritten acceleration/deceleration pattern is set as the "acceleration/deceleration pattern set in advance", transfer of a next substrate PB standing by at the position P1 is started (step S9), and a return is made to step S2 to repeat the series of processes described above.

Moreover, the present invention is not limited to the foregoing embodiment and various modifications other than those described above may be made without departing from the spirit and the scope of the present invention. For example, when a transfer lag occurs in the embodiment described above, a deceleration pattern is controlled by advancing a deceleration start timing T14 from a deceleration start timing T04 of an acceleration/deceleration pattern and setting the deceleration smaller than the deceleration of the acceleration/deceleration pattern to stop a substrate PB at the mounting work position P2. However, when transfer starts prematurely due to various factors, the deceleration pattern may be controlled as follows. In such a case, the timing T13 arrives earlier than the timing T03 and the time difference ΔT3 (=T13−T03) assumes a negative value. Therefore, the deceleration pattern need only be controlled by altering the deceleration start timing T14 and the deceleration b to stop the substrate PB detected by the sensor SNb at the mounting work position P2. As a result, a similar operational advantage as the embodiment described above is achieved.

Figure 9:
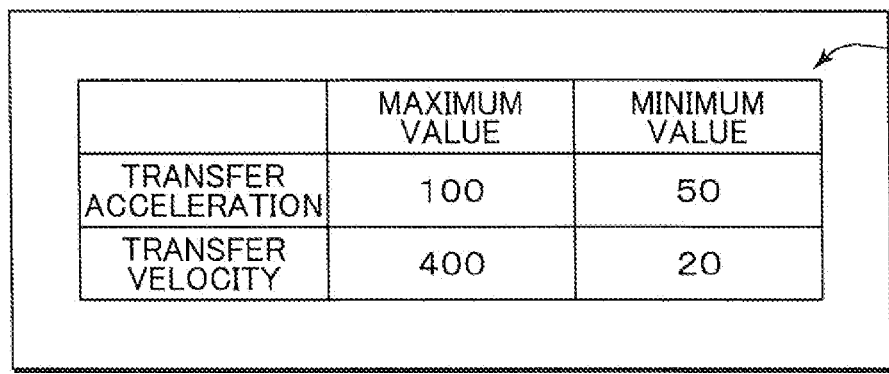
FIG. 9 is a diagram showing an example of transfer data set by a user or the like in a second embodiment of a substrate transfer apparatus according to the present invention.

In addition, while the transfer velocity V1, the maximum value 'a max' of the acceleration a, the maximum value b max of the deceleration b, and a minimum value b min of the deceleration b are fixed in the embodiment described above, there may be cases where substrate slippage is more likely to occur and cases where substrate slippage is less likely to occur, depending on substrate type. Hence, for example, as shown in FIG. 9, a configuration may be adopted in which transfer acceleration (acceleration and deceleration) and a maximum value and a minimum value of transfer velocity are displayed on a display section 41 of the displaying/operating unit 4 of the surface mounter 1, and a user or operator is able to set the various values as appropriate via an operating part (not shown) of the displaying/operating unit 4. Furthermore, a configuration may be adopted in which a transfer acceleration and a transfer velocity that are optimal for a substrate type are set by inputting substrate information indicating the substrate type such as a substrate ID or having substrate identification information such as a bar code be read.

Furthermore, while a dedicated sensor SNb for measuring an intermediate position arrival time AT is provided in the embodiment described above, a configuration may be adopted, for example, in which the head unit 6 is positioned so that the substrate recognition camera C2 fixed to the head unit 6 is positioned directly above the intermediate position P3, and the intermediate position arrival time AT is obtained by detecting the substrate PB by the substrate recognition camera C2. In this manner, by adopting a configuration in which the substrate recognition camera C2 not only fulfills a function of capturing an image of fiducial marks but also functions as "detection means" or a "detection unit" according to the present invention, the sensor SNb becomes unnecessary and cost reduction of the apparatus can be achieved.

In addition, while the substrate transfer mechanism 2 is constituted by three conveyor pairs in the embodiment described above, the number of conveyor pairs is not limited thereto and the present invention is also applicable to a substrate transfer apparatus that transfers a substrate PB by any conveyor configuration.

Furthermore, a configuration for controlling the respective motors by the controller 3 may be adopted in which encoders that output pulse signals in accordance with a rotation status of the motors are annexed and a pulse signal outputted from each encoder is supplied to the controller 3.

Moreover, while the present invention is applied to a substrate transfer apparatus installed in the surface mounter 1, an applicable range of the present invention is not limited thereto. The present invention may be applied to a printer which transfers a substrate from a substrate stop position (stand by position) P1 to a print position (work position) P2 and which prints a solder paste or the like. In addition, it is needless to say that the present invention can also be applied to a substrate transfer apparatus provided on a mounting line apparatus that combines a printer with a surface mounter.

What is claimed is:

1. A substrate transfer apparatus adapted to transfer a substrate stopped at a first position toward a second position and to stop the substrate at the second position, the substrate transfer apparatus comprising:
   a substrate transfer mechanism that transfers a substrate along a substrate transfer path extending from the first position to the second position;
   a detection unit that detects the substrate at an intermediate position between the first position and the second position when the substrate is traveling along the substrate transfer path; and
   a control unit that controls the substrate transfer mechanism, such that, when one substrate is transferred from the first position toward the second position, a velocity of the one substrate is controlled after the one substrate arrived at the intermediate position in accordance with a detecting result by the detection unit, the control unit including:
   a time measurement section adapted to measure an intermediate position arrival time that is required for transferring the one substrate from the first position to the intermediate position where the one substrate is detected by the detection unit; and
   a velocity control section adapted to control a deceleration pattern in accordance with the intermediate position arrival time so that the one substrate detected by the detection unit is decelerated to stop at the second position.

2. The substrate transfer apparatus according to claim 1, wherein the control unit further includes:
   a storage section that stores an estimated time that is a time estimated to transfer the one substrate from the first position to the intermediate position where the one substrate is detected by the detection unit when the one substrate is being transferring toward the second position according to an acceleration/deceleration pattern set in advance; and
   a time difference calculation section that calculates a time difference between the intermediate position arrival time and the estimated time, and
   wherein the velocity control section determines the deceleration pattern based on the time difference.

3. The substrate transfer apparatus according to claim 2, wherein the velocity control section adapted to control a deceleration start timing at which the one substrate detected by the detection unit is decelerated and to control the deceleration after the deceleration start timing so as to transfer the one substrate detected by the detection unit to the second position according to the deceleration pattern.

4. The substrate transfer apparatus according to claim 2, wherein the control unit controls the substrate transfer unit so that the one substrate detected by the detection unit is transferred according to the acceleration/deceleration pattern set originally in advance when the time difference is substantially nonexistent.

5. The substrate transfer apparatus according to claim 2, wherein the control unit adapted to control the substrate transfer unit so that the one substrate detected by the detection unit is transferred at the deceleration that is smaller than the deceleration of the acceleration/deceleration pattern set originally in advance when the time difference substantially exists and the intermediate position arrival time is longer than the estimated time.

6. The substrate transfer apparatus according to claim 2, said the substrate transfer apparatus transfers a plurality of substrates of a same type in an order set in advance,
wherein the control unit is adapted to rewrite the acceleration/deceleration pattern, set in advance for transferring an (n−1)th (where n is a natural number greater than 2) substrate, into an acceleration/deceleration pattern having acceleration that is greater than the acceleration used for transferring the (n−1)th substrate so that an (n)th substrate stopped at the first position is transferred toward the second position according to the rewritten acceleration/deceleration pattern.

7. The substrate transfer apparatus according to claim 6, wherein the control unit is adapted to compute a period of time required for transferring the (n)th substrate from the first position to the intermediate position where the (n)th substrate by the detection unit in response to the rewritten acceleration/deceleration pattern, and the control unit is adapted to rewrite the estimated time into the computed time.

8. A substrate transfer apparatus adapted to transfer a substrate stopped at a first position toward a second position and to stop the substrate at the second position, the substrate transfer apparatus comprising:
a substrate transfer mechanism that transfers a substrate along a substrate transfer path extending from the first position to the second position;
a detection unit that detects the substrate at an intermediate position between the first position and the second position when the substrate is traveling along the substrate transfer path; and
a control unit that controls the substrate transfer mechanism,
the control unit including:
a time measurement section adapted to measure an intermediate position arrival time that is required for transferring the substrate from the first position to the intermediate position where the substrate is detected by the detection unit;
a velocity control section adapted to control a deceleration pattern in accordance with the intermediate position arrival time so that the substrate detected by the detection unit is decelerated to stop at the second position;
a storage section that stores an estimated time that is a time estimated to transfer the substrate from the first position to the intermediate position where the substrate is detected by the detection unit when the substrate is being transferring toward the second position according to an acceleration/deceleration pattern set in advance; and
a time difference calculation section that calculates a time difference between the intermediate position arrival time and the estimated time,
wherein the velocity control section determines the deceleration pattern based on the time difference,
the substrate transfer apparatus transfers a plurality of substrates of a same type in an order set in advance,
the control unit is adapted to rewrite the acceleration/deceleration pattern, set in advance for transferring an (n−1)th (where n is a natural number greater than 2) substrate, into an acceleration/deceleration pattern having acceleration that is greater than the acceleration used for transferring the (n−1)th substrate so that an (n)th substrate stopped at the first position is transferred toward the second position according to the rewritten acceleration/deceleration pattern, and
the control unit is adapted to compute a period of time required for transferring the (n)th substrate from the first position to the intermediate position where the substrate by the detection unit in response to the rewritten acceleration/deceleration pattern, and the control unit is adapted to rewrite the estimated time into the computed time.

* * * * *